(12) United States Patent
Huang et al.

(10) Patent No.: US 9,985,231 B2
(45) Date of Patent: May 29, 2018

(54) COMPOSITIONALLY GRADED BULK HETEROJUNCTION DEVICES AND METHODS OF MANUFACTURING THE SAME

(71) Applicant: NUtech Ventures, Lincoln, NE (US)

(72) Inventors: Jinsong Huang, Lincoln, NE (US); Zhengguo Xiao, Lincoln, NE (US)

(73) Assignee: NUtech Ventures, Inc., Lincoln, NE (US)

( * ) Notice: Subject to any disclaimer, the term of this patent is extended or adjusted under 35 U.S.C. 154(b) by 154 days.

(21) Appl. No.: 15/042,692

(22) Filed: Feb. 12, 2016

(65) Prior Publication Data

US 2016/0268531 A1   Sep. 15, 2016

Related U.S. Application Data

(60) Provisional application No. 62/120,537, filed on Feb. 25, 2015.

(51) Int. Cl.
| | |
|---|---|
| *H01L 51/42* | (2006.01) |
| *H01L 31/18* | (2006.01) |
| *H01L 51/00* | (2006.01) |
| *H01L 35/34* | (2006.01) |

(52) U.S. Cl.
CPC ...... *H01L 51/4253* (2013.01); *H01L 51/0003* (2013.01); *H01L 51/0036* (2013.01); *H01L 51/0037* (2013.01); *H01L 51/0043* (2013.01); *H01L 51/0047* (2013.01); *H01L 2251/308* (2013.01); *Y02E 10/549* (2013.01)

(58) Field of Classification Search
CPC ............. H01L 51/0001; H01L 51/0002; H01L 51/0003; H01L 51/0034; H01L 51/0035; H01L 51/0036; H01L 51/0037; H01L 51/0038; H01L 51/0039; H01L 51/0043; H01L 51/0045; H01L 51/0046; H01L 51/0047; H01L 51/10; H01L 51/4253; H01L 51/424; H01L 2251/308; H01L 31/18

See application file for complete search history.

(56) References Cited

U.S. PATENT DOCUMENTS

| | | | | |
|---|---|---|---|---|
| 2010/0276731 | A1* | 11/2010 | Nam .................. | H01L 21/02521 257/184 |
| 2012/0207947 | A1* | 8/2012 | Hadipour ............... | B82Y 10/00 427/553 |
| 2015/0311364 | A1* | 10/2015 | Wu ..................... | H01L 51/0003 438/82 |

* cited by examiner

*Primary Examiner* — Susan D Leong
(74) *Attorney, Agent, or Firm* — Leydig, Voit & Mayer, Ltd; Gerald T. Gray

(57) ABSTRACT

Systems and methods are described to form compositionally graded BHJ structures utilizing solvent-fluxing techniques. In implementations, the systems and methods described herein involve a high boiling point additive, a solution of a polymer donor and an acceptor, a substrate material, a working solvent, and a flux solvent for formation of compositionally graded BHJ structures.

17 Claims, 10 Drawing Sheets

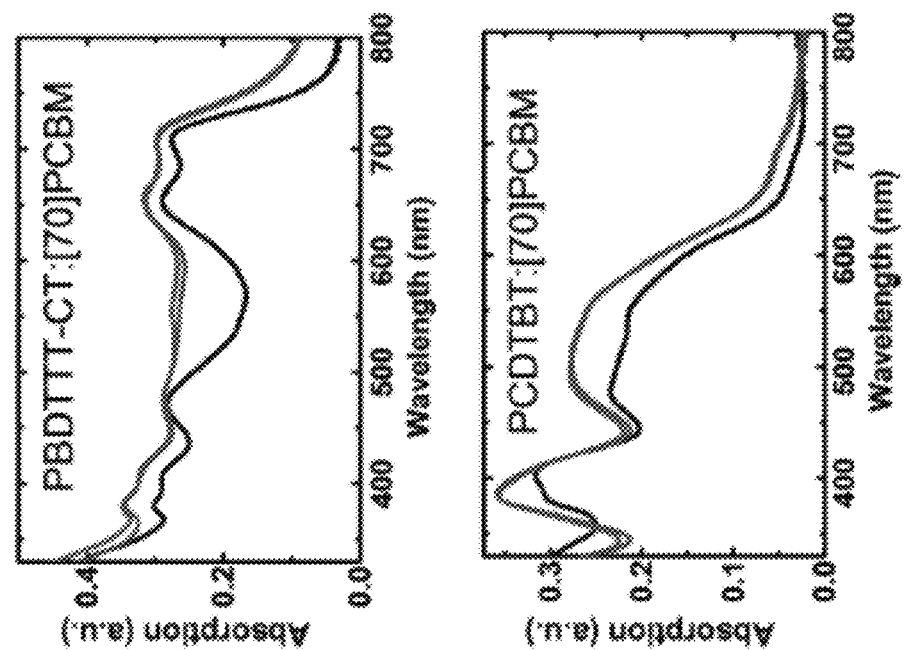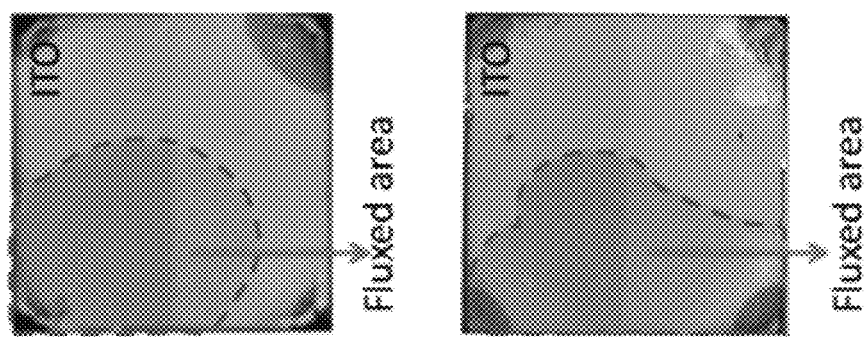
FIG. 4

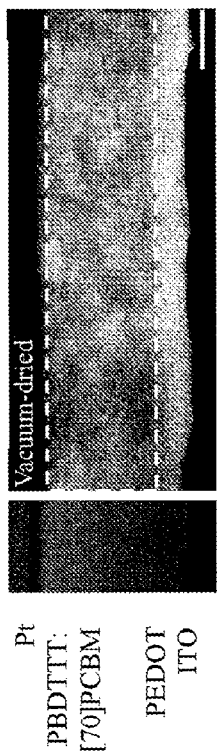
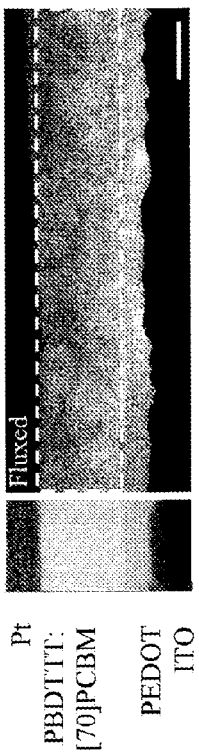
FIG. 5A
FIG. 5B
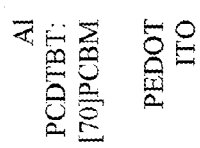
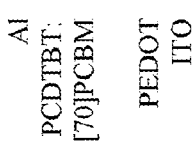
FIG. 5C
FIG. 5D

Table 1. Statistics of PCE of different kinds of solar cells with regular BHJ (vacuum-dried) and Graded BHJ (solvent-fluxed) structure.

| Materials | Blend film drying methods | Jsc (mA/cm²) | Voc (V) | FF (%) | PCE Average | PCE Best |
|---|---|---|---|---|---|---|
| PCDTBT:[70]PCBM | Vacuum-dried | 10.5 ± 0.4 | 0.88 ± 0.01 | 55.0 ± 0.5 | 5.20% ± 0.20 | 5.4% |
| | Methanol-fluxing | 11.3 ± 0.4 | 0.92 ± 0.01 | 65.7 ± 0.7 | 6.95% ± 0.15 | 7.2% |
| PBDTTT-CT:[70]PCBM | Vacuum-dried | 16.4 ± 0.4 | 0.76 ± 0.01 | 55.5 ± 0.5 | 6.90% ± 0.10 | 7.0% |
| | Methanol-fluxing | 17.2 ± 0.3 | 0.78 ± 0.01 | 63.3 ± 0.7 | 8.40% ± 0.20 | 8.8% |
| P3HT:[60]PCBM | Vacuum-dried | 9.8 ± 0.2 | 0.62 ± 0.01 | 60.9 ± 0.5 | 4.90% ± 0.10 | 5.0% |
| | Methanol-fluxing | 10.3 ± 0.2 | 0.60 ± 0.01 | 72.1 ± 0.3 | 5.90% ± 0.10 | 6.0% |
| PTQ:[70]PCBM | Vacuum-dried | 9.6 ± 0.3 | 0.88 ± 0.01 | 49.0 ± 0.8 | 4.20% ± 0.20 | 4.4% |
| | Methanol-fluxing | 10.9 ± 0.2 | 0.88 ± 0.01 | 61.3 ± 0.5 | 5.80% ± 0.20 | 6.0% |

FIG. 7

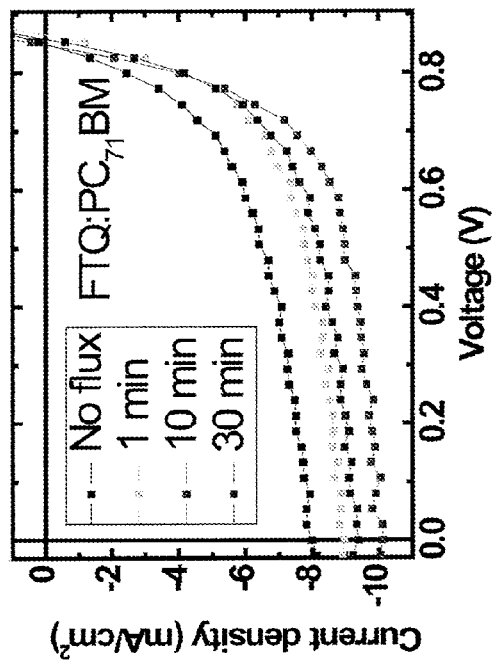
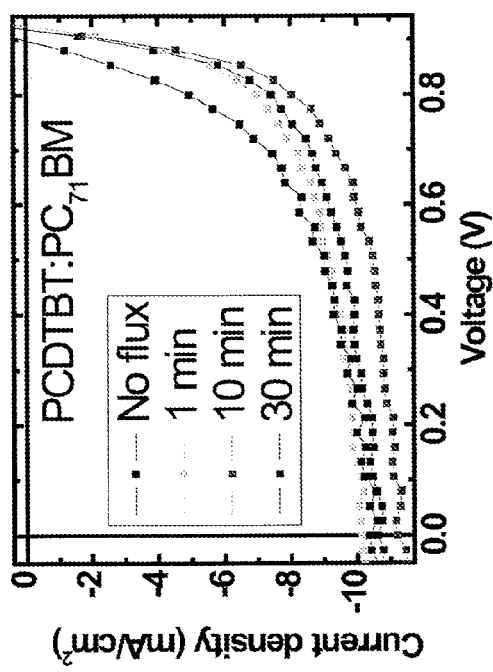
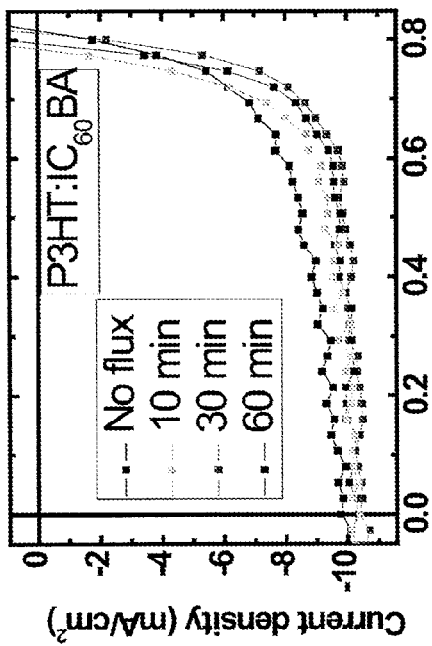
FIG. 9A
FIG. 9B

COMPOSITIONALLY GRADED BULK HETEROJUNCTION DEVICES AND METHODS OF MANUFACTURING THE SAME

CROSS-REFERENCE TO RELATED APPLICATIONS

This patent application claims the benefit of U.S. Provisional Patent Application No. 62/120,537, filed Feb. 25, 2015, which is incorporated herein by reference.

FEDERALLY SPONSORED RESEARCH OR DEVELOPMENT

This invention was made with Government support under Grant Nos. ECCS-1201384 and ECCS-1252623 awarded by the National Science Foundation. The Government has certain rights in this invention.

BACKGROUND

Photovoltaic devices generally include stacked layers of photoelectric materials and electrodes that convert light energy into electrical energy. The photoelectric materials can include silicon-based materials, polymeric materials, organic materials, and the like. Photovoltaic devices that use organic materials as the active layer are termed organic photovoltaic devices (OPVs) and can have varying structures depending on efficiency characteristics, design characteristics, and so forth. One such type of OPV structure includes bulk heterojunction (BHJ) structures that utilize various morphologies of electron donor and electron acceptor materials that are mixed or blended together. The morphology of the electron donor and electron acceptor materials of the BHJ structures can influence the efficiency of the associated photovoltaic devices.

The discovery of bulk heterojunction (BHJ) structures has paved the road for high efficiency energy conversion by organic photovoltaic devices (OPVs). The morphology of BHJ films plays a critical role in charge generation, collection, or recombination in BHJ OPV devices. A theoretical BHJ film morphology can include a bicontinuous interdigitated donor and acceptor network with donor and acceptor nanodomains within the exciton diffusion lengths or the uncertain length of light for efficient charge generation and extraction. However, actual morphologies of most BHJ films are generally far from ideal due to the random mixing of donors and acceptors in solution. Regular BHJ films fabricated from a blended solution inevitably have many breaks and dead ends. Techniques such as thermal annealing, solvent annealing, and mixing additives have been shown to successfully improve the morphologies of some BHJ films by increasing crystallinity of the donors and acceptors and/or forming nanodomains of donors and acceptors with suitable domain size to facilitate exciton dissociation and charge generation. However, these techniques do not address connectivity of the donor and acceptor network and are only applicable to specific material systems.

Other BHJ structures can utilize pre-formed n-type nanorod/nanowire arrays followed by infiltration of semiconducting polymers, but such structures do not provide power conversion efficiencies (PCEs) comparable to those made of blended films, which can be limited by interface issues.

Another issue with regular BHJ films involves a mismatch between the photocurrent distribution and charge transport channel width in the vertical direction, such as having an electron current that is higher toward the cathode side and a hole current that is higher toward the anode side (e.g., which can be due to nonsymmetrical charge collection in OPVs), whereas the distribution of donors and acceptors in such BHJ films is generally uniform due to the uniform mixing of them in solution. This mismatch can cause a piling up of photogenerated charges, resulting in recombination, and can severely reduce device PCE when the photogenerated charge density is high (e.g., low bandgap active layers, strong illumination, or so forth), or when photogenerated charges cannot be efficiently extracted out of the active layer due to low carrier mobility or a thick active layer. Such morphologies can cause charge recombination in the BHJ films and at the metal/organic interface, where the charge recombination can involve geminate recombination or bimolecular recombination.

Another BHJ structure includes compositionally graded BHJ films, which are donor enriched at the anode and acceptor enriched at the cathode side, and can facilitate the charge extraction and reduce charge recombination. Such graded structures can provide a donor rich anode side and an acceptor rich cathode side to better match the distribution of current, which can reduce the piling up of electrons close to the cathode side and holes close to the anode side and reduce the leakage of photogenerated charges to the wrong electrodes, thus reducing bimolecular charge recombination. However, fabrication techniques of some compositionally graded BHJ structures can affect the efficiency of the structures, such as by imparting limited bicontinuous connectivity of donors and acceptors.

Accordingly, there is a need for improved graded BHJ structures and methods of forming the same.

SUMMARY

The present disclosure provides compositionally graded BHJ structures and systems and methods for forming such compositionally graded BHJ structures utilizing solvent-fluxing techniques, and devices incorporating the graded BHJ structures.

According to an embodiment, a method of forming a graded bulk heterojunction (BHJ) structure is provided. The method typically includes providing a solution including a polymer donor material, an acceptor material, and an additive, introducing a fluxing solvent to the solution (blend film with additive), and removing the fluxing solvent and the additive to form a graded BHJ structure, wherein the graded BHJ structure includes a graded composition of donor and acceptor materials with an increasing acceptor material percentage along a first direction. In certain aspects, the acceptor material comprises a fullerene-derivative.

In certain aspects, the fullerene derivative is selected from the group consisting of of [6,6]-phenyl-C61-butyric acid ($PC_{60}BM$), [6,6]-(4-fluoro-phenyl)-$C_{61}$-butyric acid methyl ester (FPCBM), [6,6]-phenyl-C71 butyric acid methyl ester ($PC_{70}BM$), indene-C60 bisadduct ($IC_{60}BA$), indene-C70 bisadduct ($IC_{70}BA$), fullerene-C60, fullerene-C70, carbon nanotubes (CNT), a carbon onion, and combinations thereof. In certain aspects, the donor material includes a polymer donor selected from the group consisting of poly(3-hexyl-thiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), Poly[6-fluoro-2,3-bis-(3-octyloxyphenyl) quinoxaline-5,8-diyl-alt-thiophene-2,5-diyl] (FTQ), subphthalocyanine (SubPC), copper phthalocyanine (CuPc), Zinc phthalocyanine (ZnPc), poly(3-hexylthiophene) (P3HT), poly(3-octylthiophene) (P3T), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkyl-quarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]](PTB7), poly-(2,5-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole](PFDDTBT), poly{[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,3-benzothiadiazole)]} (BisDMO-PFDTBT), poly[N-9''-heptadecanyl-2,7-carbazole-alt-5,5-(4',7'-di-2-thienyl-2',1',3'-benzothiadiazole)](PCDTBT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly(benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), and combinations thereof. In certain aspects, the acceptor material comprises a fullerene, fullerene derivative, a perylene, perylene derivative, a 2,7-dicyclohexyl benzo[lmn][3,8]phenanthroline derivative, a 1,4-diketo-3,6-dithienylpyrrolo[3,4-c]pyrrole (DPP) derivative, a tetracyanoquinodimethane (TCNQ) derivative, a poly(p-pyridyl vinylene) (PPyV) derivative, a 9,9'-bifluorenylidene (99BF) derivative, a benzothiadiazole (BT) derivative, and combinations thereof. In certain aspects, the acceptor material comprises [70]PCBM and the donor comprises one of poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl] (PBDTTT-CT) or poly[N-9'-hepta-decanyl-2,7-carbazole-alt-5,5-(4',7'-di-2-thienyl-2',1',3'-enzothiadiazole)] (PCDTBT) or Poly[6-fluoro-2,3-bis-(3-octyloxyphenyl) quinoxaline-5,8-diyl-alt-thiophene-2,5-diyl] (FTQ).

In certain aspects, removing the fluxing solvent and the additive includes spinning off the fluxing solvent, wherein during the spinning the additive fluxes away in a fluxing direction along with the fluxing solvent, e.g., wherein the first direction is the fluxing direction. In certain aspects, the additive comprises a material having a boiling point that is greater than a boiling point of a working solvent used to dissolve the polymer donor material and the acceptor material. In certain aspects, the additive comprises 1,8-diiodooctane (DIO) and wherein the working solvent comprises 1,2-Dichlorobenzene (DCB). In certain aspects, the additive is selected from the group consisting of 1,8-diiodooctane (DIO) chlorobenzene, 4-butanedithiol, 1,6-hexanedithiol, 1,8-octanedithiol, 1,9-nonanedithiol, class of 1,8-di(R)octanes with various functional groups, di(ethylene glycol)-diethyl ether, and n-methyl-2-pyrrolidinone, 1,6-diiodohexane, 1,4-diiodobutane. In certain aspects, providing a solution includes applying a layer of the solution on a substrate to form a solution layer on the substrate, and wherein introducing a fluxing solvent to the solution includes introducing the fluxing solvent to the solution layer. In certain aspects, applying a layer includes spin coating the solution onto the substrate.

In certain aspects, the substrate includes indium tin oxide (ITO). In certain aspects, the method further includes forming an electrode layer on a first side of the graded BHJ structure opposite the substrate, wherein the acceptor material percentage is higher on the first side. In certain aspects, the fluxing solvent comprises an alcohol. In certain aspects, the fluxing solvent comprises one of methanol, ethanol or isopropanol.

According to another embodiment, a photoactive device is provided that typically includes a first electrode, a second electrode, and a graded bulk heterojunction (BHJ) structure between the first and second electrodes, wherein the graded BHJ structure is formed according to an above method, and wherein the first direction is a direction from the first electrode to the second electrode.

According to yet another embodiment, a photoactive device is provided that typically includes a first electrode, a second electrode, and a graded bulk heterojunction (BHJ) structure between the first and second electrodes, wherein the graded BHJ structure includes a graded composition of donor and acceptor materials with an increasing acceptor material percentage along a direction from the first electrode to the second electrode.

In certain aspects, the acceptor material of the device includes [70]PCBM and the polymer donor is one of poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT) or poly[N-9'-heptadecanyl-2,7-carbazole-alt-5,5-(4',7'-di-2-thienyl-2',1',3'-enzothiadiazole)] (PCDTBT) or Poly[6-fluoro-2,3-bis-(3-octyloxyphenyl) quinoxaline-5,8-diyl-alt-thiophene-2,5-diyl] (FTQ).

In certain aspects, the acceptor material of the device includes a fullerene derivative selected from the group consisting of [6,6]-phenyl-C61-butyric acid (PC60BM), [6,6]-(4-fluoro-phenyl)-C61-butyric acid methyl ester (FPCBM), [6,6]-phenyl-C71 butyric acid methyl ester (PC70BM), indene-C60 bisadduct (IC60BA), indene-C70 bisadduct (IC70BA), fullerene-C60, fullerene-C70, carbon nanotubes (CNT), a carbon onion, and combinations thereof, and the donor material of the device includes a polymer donor selected from the group consisting of poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), Poly[6-fluoro-2,3-bis-(3-octyloxyphenyl) quinoxaline-5,8-diyl-alt-thiophene-2,5-diyl](FTQ), subphthalocyanine (SubPC), copper phthalocyanine (CuPc), Zinc phthalocyanine (ZnPc), poly(3-hexylthiophene) (P3HT), poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), poly-(2,5-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9''-hepta-decanyl-2,7-carbazole-alt-5,5-(4',7'-di-2-thienyl-2',1',3'-benzothiadiazole)] (PCDTBT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly (benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), and combinations thereof.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIG. 4 includes images of example BHJ films with partial areas fluxed and the corresponding absorption spectra measured at both fluxed and pristine areas.

FIGS. 5a and 5b show Energy-Filtered Transmission Electron Microscopy (EFTEM) images of example vacuum-dried BHJ films.

FIGS. 5c and 5d show Energy-Filtered Transmission Electron Microscopy (EFTEM) images of example solvent-fluxed BHJ films formed according to an embodiment.

FIG. 7 is a table of properties associated with power conversion efficiencies (PCE) of various solar cells including devices according to various embodiments.

FIG. 9 shows device performance with different time intervals between spin coating and solvent flux.

DETAILED DESCRIPTION

The present embodiments provide compositionally graded BHJ structures and solvent-fluxing systems and methods for forming compositionally graded BHJ structures. Such solvent-fluxing systems and methods are applicable to solution-processed BHJ films which involve additives. In certain embodiments, the systems and methods described herein include a high boiling point additive, a solution of a polymer donor and an acceptor, a substrate material, a working solvent, and a flux solvent for formation of compositionally graded BHJ structures. The fluxing process provides improved morphologies of BHJ films by forming more uniform acceptor and donor domain distributions in the plane direction of the films that results in higher charge collection efficiency. Example solvent-fluxed BHJ OPVs according to the present embodiments provide PCE enhancements of 15-50% relative to non-fluxed BHJ OPVs.

In the following discussion, compositionally graded BHJ structures and devices incorporating the same and example methods for forming the compositionally graded BHJ structures using solvent-fluxing processes are presented.

Example Structure

Figure 1A:
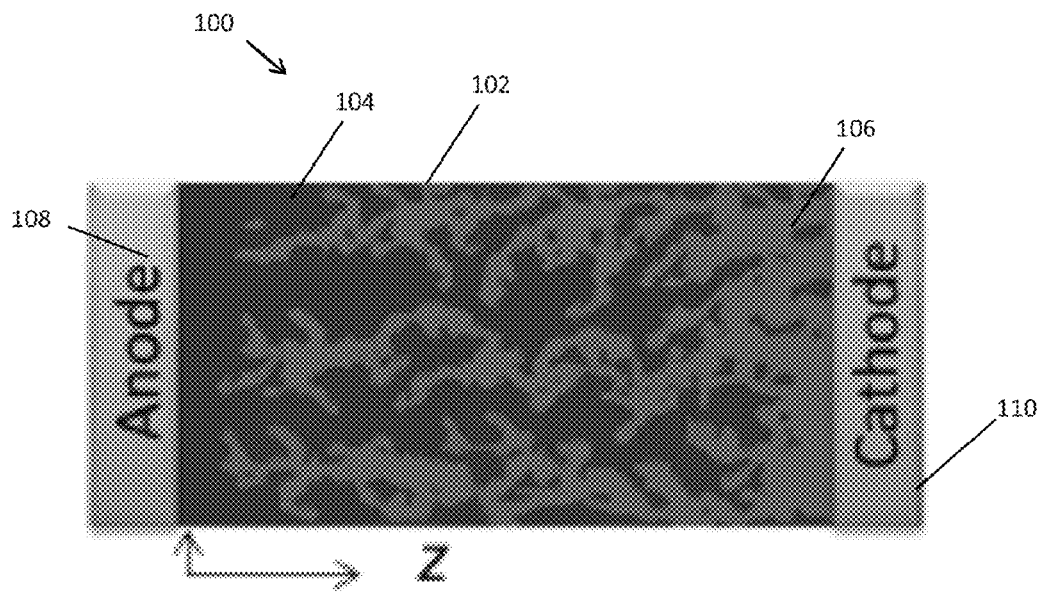
FIG. 1A is a schematic diagram of a photovoltaic device having a graded bulk heterojunction (BHJ) structure in accordance with an embodiment of the present disclosure.
Figure 1B:
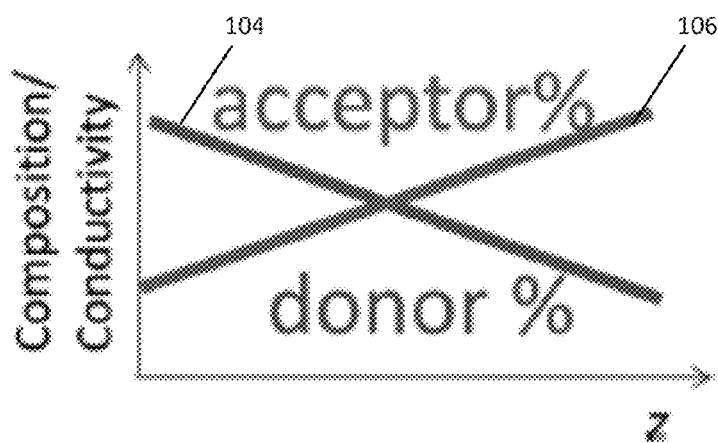
FIG. 1B is a chart illustrating composition and conductivity of a donor material and an acceptor material of the BHJ structure of FIG. 1A in accordance with an embodiment of the present disclosure.

Referring to FIG. 1A, a photoactive having a graded bulk heterojunction (BHJ) structure 102 is shown is accordance with an example embodiment. The graded BHJ structure 102 includes a donor material 104 and an acceptor material 106 arranged in a graded compositional distribution, where the composition of the donor material 104 is highest at an anode 108 side of the photoactive device 100 and reduces or tapers off toward a cathode 110 side of the photoactive device 100, and where the composition of the acceptor material 106 is highest at the cathode 110 side of the photovoltaic device 100 and reduces or tapers off toward the anode 108 side of the photovoltaic device 100. The composition of the donor material 104 and the acceptor material 106 may include organic materials that form an organic photovoltaic device (OPV). As shown in FIG. 1B, the composition and conductivity of donor material 104 decreases over the z axis, which represents the axis that transitions from the anode 108 to the cathode 110, whereas the composition and conductivity of acceptor material 106 increases over the z axis. Larger composition percentages can correspond to wider charge transportation paths, which can account for larger effective conductivity.

Example Method

Figure 2:
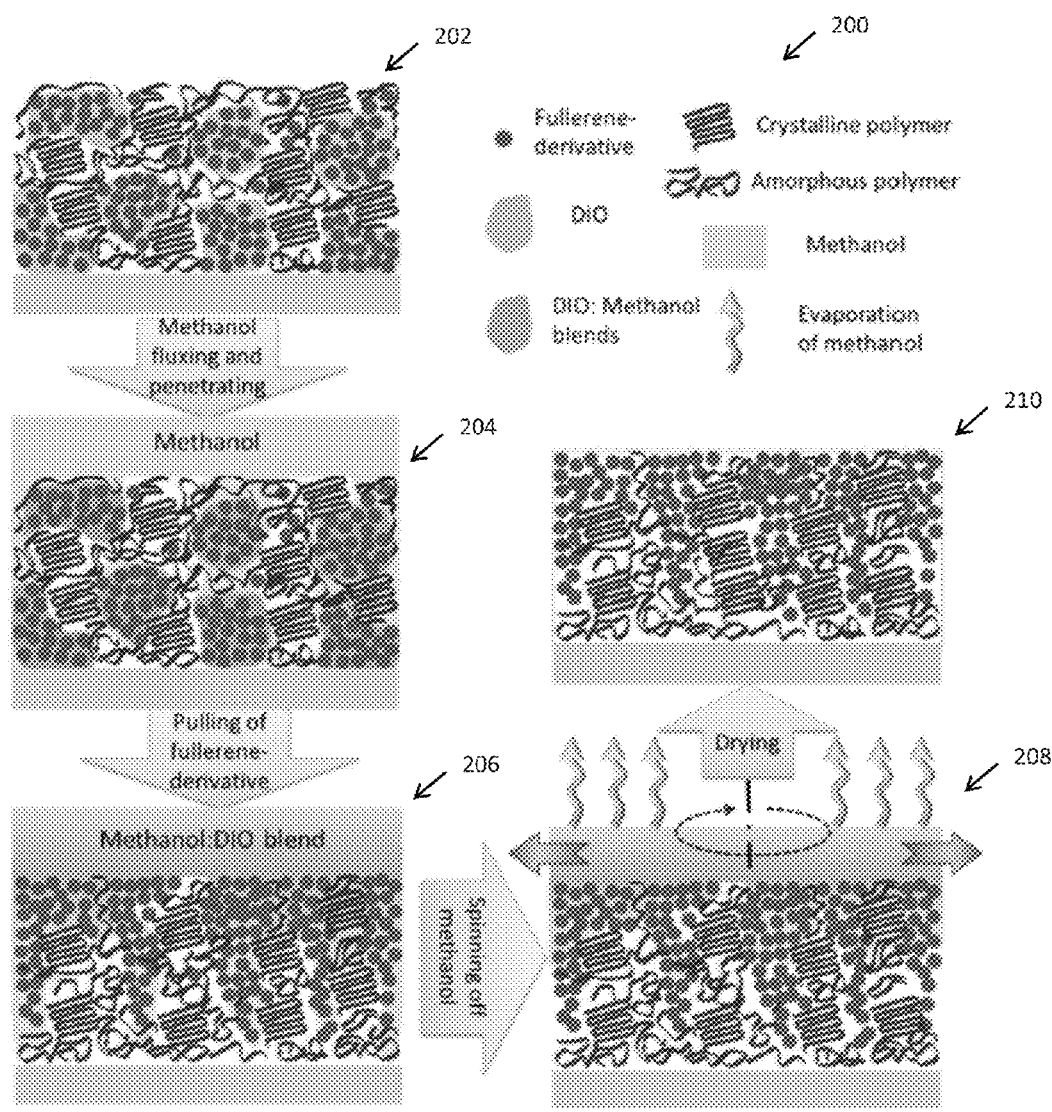
FIG. 2 is a diagrammatic flow of a method for forming graded bulk heterojunction structure via solvent-fluxing according to an embodiment.

Referring to FIG. 2, a diagrammatic flow of a method 200 for forming compositionally graded bulk heterojunction (BHJ) structures is provided. The diagrammatic flow provides five depictions of various steps and structures associated with method 200, labeled as 202, 204, 206, 208, and 210. In step 202, a high boiling point additive is introduced to a solution of a donor material and an acceptor material (and working solvent). In the context as used herein, the term "high boiling point" refers to a boiling point that is greater than the boiling point of the working solvent used to dissolve the donor material and the acceptor material. The example embodiment of 202 shows 1,8-diiodooctane (DIO) as the high-boiling point additive added to a fullerene-derivative polymer donor solution. The polymer donor:fullerene-derivative solution with the additive is then applied to a substrate material in a step (not shown) intermediate to steps 202 and 204. For example, a spin coating process (or doctor blading, spray coating, etc.) can apply or coat the blended solution of the polymer donor:fullerene-derivative solution with the additive onto a surface of a substrate. The substrate can include, but is not limited to, an indium tin oxide (ITO)/poly(3,4-ethylenedioxythiophene):poly(styrenesulfonate) (PEDOT:PSS) substrate. In certain embodiments, the working solvent, such as 1,2-Dichlorobenzene (DCB), evaporates while the additive (e.g., DIO) remains in the blended film for a long time due to its high boiling temperature (e.g., 333° C. for DIO). DIO can provide desirable solvent characteristics for fullerene-derivatives (e.g., >120 mg/mL for PCBM) in part due to strong interactions caused by the partial negative charge of iodine in DIO and electro-deficient properties of fullerene-derivatives. In certain embodiments, the additive (e.g., DIO) facilitates the formation of fullerene-derivative nanodroplets during evaporation of the working solvent (e.g., DCB).

In step 204, a fluxing solvent is applied to the coated substrate; the blended solution of the polymer donor:fullerene-derivative solution with the additive is then fluxed with a low boiling point solvent (fluxing solvent). For example, fluxing may include adding to, dripping on or otherwise applying or introducing the fluxing solvent to the blended solution on the substrate. The low boiling point solvent can include, but it not limited to, an alcohol (e.g., methanol, ethanol, etc) or other solvent that extracts the high boiling point additive (e.g., DIO shown in FIG. 2), but that does not appreciably dissolve the donor material or the acceptor material. For example, FIG. 2 shows a step of methanol fluxing the wet blended film of 202 to provide the structure associated with step 204, wherein methanol penetrates into the blended film along the DIO regions. Methanol does not significantly dissolve fullerene-derivatives or semiconducting polymers but mixes very well with DIO. Therefore, in embodiments, after introducing the flux solvent on the top of the blended films, the flux solvent penetrates into the wet films, dissolves the additive, and connects the DIO:fullerene-derivative nanodroplets, as illustrated in 204. In embodiments, the portions of the additive that are dissolved in the flux solvent diffuse to the surface of the films, indicated by darkening of the film after introducing the flux solvent onto the film because solid-state fullerene has a much stronger absorption in the visible range than fullerene solution. The fast extraction of the additive from inside of the BHJ film brings some fullerene-derivatives dissolved in the additive toward the film surface and thus forms the structure having a graded composition in the vertical direction, as illustrated in 206.

The method 200 further includes removing the flux solvent from the blended film, which can also include fluxing away the additive. For example, as shown in FIG. 2, the flux solvent (e.g., methanol) is spun off the surface of the film, while fluxing the away the additive (e.g., DIO) by the flux solvent (e.g., methanol) to provide the structure shown in 208. In step 208, structure may be further dried at an appropriate temperature to provide the graded BHJ structure shown in 210. In embodiments, the method 200 advantageously results in a graded BHJ structure, with an increasing fullerene-derivative (i.e., acceptor) percentage from bottom to top, formed after the fluxing solvent is removed by drying. In certain embodiments, a conductive material is deposited on, applied to or otherwise formed on the side (top of structure in 210) opposite the substrate. The conductive layer may form cathode layer 110 (FIG. 1A; where substrate layer functions as anode 108) or conductive layer may form anode layer 108 (FIG. 1A; where substrate layer functions as cathode 110) of a photoactive device 100.

According to various embodiments, example conductive materials for the conductive layer (and/or substrate) may include gold (Au), silver (Ag), titanium (Ti), indium tin oxide (ITO), copper (Cu), carbon nanotubes, graphene, aluminum (Al), chromium (Cr), lead (Pb), platinum (Pt), and PEDOT:PSS ITO. The conductive layer (and/or substrate) is transparent or semi-transparent in certain embodiments to facilitate light reaching the active layer 102. In certain aspects, the conductive layers (anode and cathode) each have a thickness of between about 10 nm and about 100 nm or greater (e.g., less than about 200 nm, or less than about 1000 nm, or less than about 1 m, or less than about 1 mm, or less than about 1 cm), depending on the conductivity of the materials used.

EXAMPLES

According to various embodiments, example donor materials may include polymer donor materials ("polymer donors") such as, but not limited to, poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl](PBDTTT-CT), poly[N-9'-hepta-decanyl-2,7-carbazole-alt-5,5-(4',7'-di-2-thienyl-2',1',3'-enzothiadiazole)] (PCDTBT), Poly[6-fluoro-2,3-bis-(3-octyloxyphenyl) quinoxaline-5,8-diyl-alt-thiophene-2,5-diyl] (FTQ), subphthalocyanine (SubPC), copper phthalocyanine (CuPc), Zinc phthalocyanine (ZnPc), poly (3-hexylthiophene) (P3HT), poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), poly-(2,5-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9'''-hepta-decanyl-2,7-carbazole-alt-5,5-(4',7'-di-2-thienyl-2',1',3'-benzothiadiazole)] (PCDTBT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly (benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), and combinations thereof.

According to various embodiments, example acceptor materials include, but are not limited to, a fullerene or derivatives thereof, a perylene or perylene derivative, a 2,7-dicyclohexyl benzo[lmn][3,8]phenanthroline derivative, a 1,4-diketo-3,6-dithienylpyrrolo[3,4-c]pyrrole (DPP) derivative, a tetracyanoquinodimethane (TCNQ) derivative, a poly(p-pyridyl vinylene) (PPyV) derivative, a 9,9'-bifluorenylidene (99BF) derivative, a benzothiadiazole (BT) derivative, and combinations thereof. For instance, fullerenes and derivatives thereof can be used to form the acceptor layer. For example, the following materials can be also used as electron acceptor materials: [6,6]-phenyl-C61-butyric acid ($PC_{60}BM$, also referred to herein as PCBM), [6,6]-(4-fluoro-phenyl)-$C_{61}$-butyric acid methyl ester (FPCBM), [6,6]-phenyl-C71 butyric acid methyl ester ($PC_{70}BM$ or [70]PCBM), indene-C60 bisadduct ($IC_{60}BA$ or [60]ICBA), indene-C70 bisadduct ($IC_{70}BA$), fullerene-C60, fullerene-C70, carbon nanotubes (CNT), a carbon onion, and combinations thereof.

Figure 3:
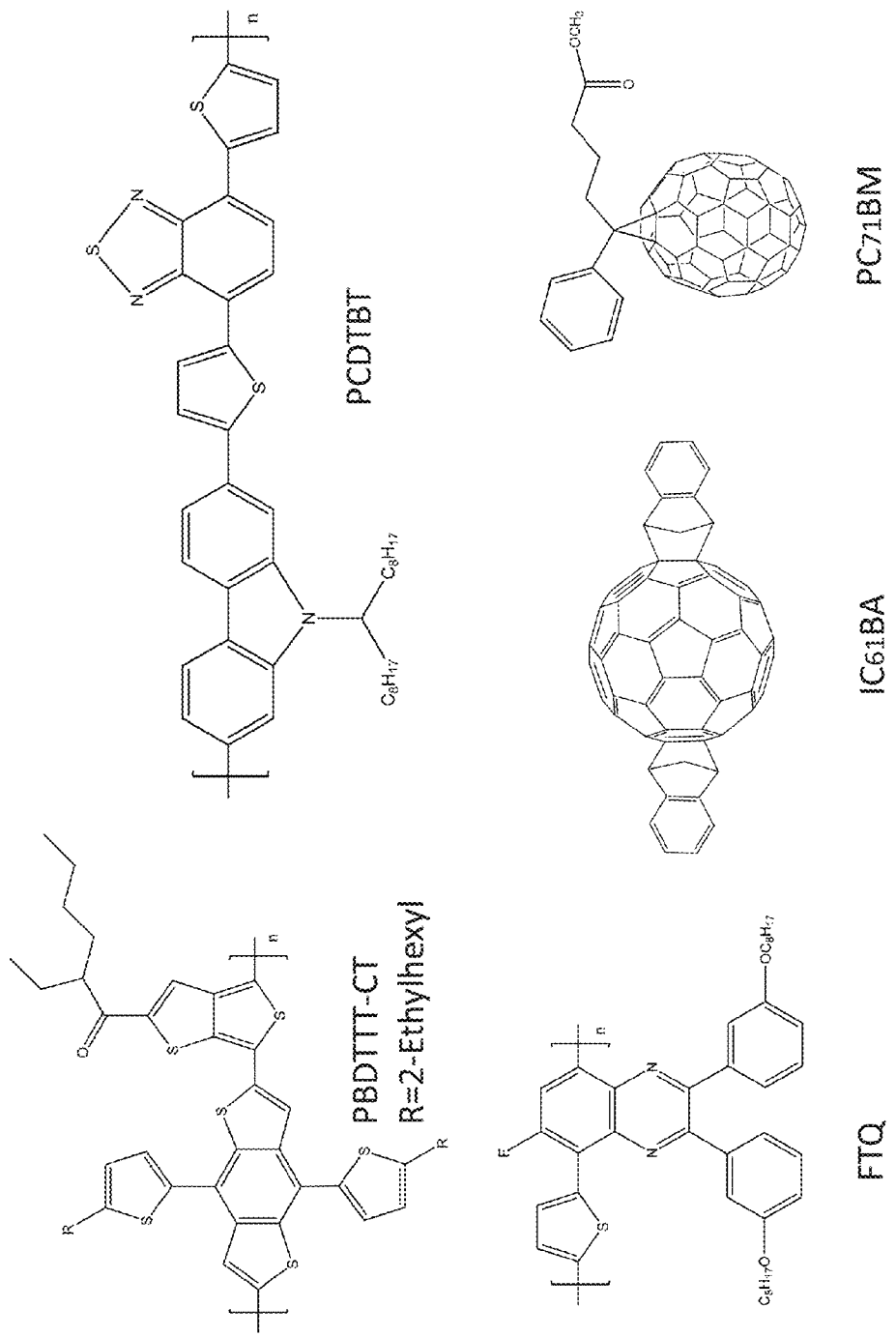
FIG. 3 illustrates chemical structures of donor materials and acceptor materials in accordance with example embodiments of the present disclosure.

Chemical structures of example donor and acceptor materials are shown in FIG. 3.

According to various embodiments, example fluxing solvents may include an alcohol (e.g., methanol, ethanol, isopropanol, etc), ethyl acetate, ethyl ether, acetone, heptane, iso-butanol, n-hexane hydrochloric acid, tert-butanol, methanol, carbon tetrachloride, methylene chloride, chloroform, pentane, hexane, petroleum ether, cyclopentane, cichloromethane, diethyl ether, tetrahydrofuran, dimethyl formamide, dimethyl sulfoxide, trifluoroacetic acid, dioxane, water, ethanol, xylene, and others. According to certain embodiments, example additive materials include 1,8-diiodooctane (DIO), chlorobenzene, 4-butanedithiol, 1,6-hexanedithiol, 1,8-octanedithiol, 1,9-nonanedithiol, class of 1,8-di(R)octanes with various functional groups, di(ethylene glycol)-diethyl ether, and N-methyl-2-pyrrolidinone, 1,6-diiodohexane, 1,4-diiodobutane, and others.

In the following description, high efficiency material system embodiments, including PBDTTT-CT:[70]PCBM and PCDTBT:[70]PCBM and their associated material and device characterizations, are discussed. The extraction of DIO by methanol-fluxing can be observed by the naked eye because of the color change associated with the BHJ films. The dried BHJ films have deeper color than the wet film due to the stronger Pi-Pi conjugation between the solid semiconductor molecules, which were observed in all of the BHJ films tested. For example, FIG. 4 provides pictures of PBDTTT-CT:[70]PCBM and PCDTBT:[70]PCBM films with partial areas fluxed and the corresponding absorption spectra measured at both fluxed and pristine areas. The methanol-fluxed areas are darker than the rest for both PBDTTTCT:[70]PCBM and PCDTBT:[70]PCBM films. The absorption spectra in the fluxed areas correspond similarly to those of the overnight, vacuum-dried BHJ films. This gives a direct correlation between the color changes and the extraction of DIO by solvent-fluxing. A functionally difference between methanol-fluxing and vacuum-drying of DIO is that the quick extraction of DIO nanodroplets by methanol will also pull some fullerene-derivatives toward the BHJ film surfaces and thus form the graded BHJs.

Figure 5E:
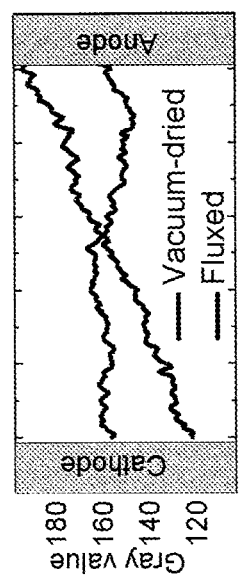
FIGS. 5e and 5f show the gray values of the cross-section EFTEM images in FIG. 5a-d.
Figure 5G:
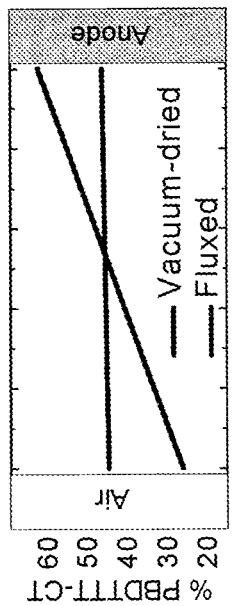
FIG. 5g shows a result of quantitative determination by ellipsometry along the vertical direction of the composition of vacuum-dried and solvent-fluxed PBDTTT-CT:[70]PCBM films.
Figure 5I:
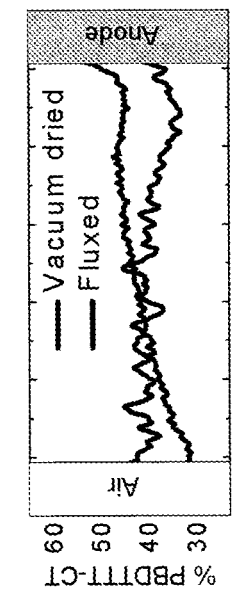
FIG. 5i shows a compositional depth profile of a PBDTTT-CT:[70]PCBM film measured by secondary ion mass spectrometry (SIMS).
Figure 5F:
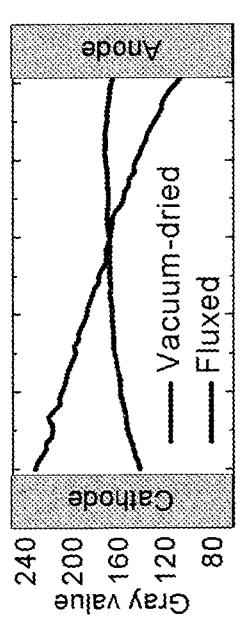

The formation of graded BHJs by methanol-fluxing was verified by multiple characterization methods. First, the formation of the graded BHJs was revealed by measuring the vertical composition profile of PBDTTT-CT:[70]PCBM and PCDTBT:[70]PCBM films using Energy-Filtered Transmission Electron Microscopy (EFTEM). The low energy plasmon peak (19±4 eV) of polymer donors was used to highlight the donor so that brighter regions (higher gray value) represent donor-rich region in the EFTEM images. FIGS. 5a through 5d are representative EFTEM images of films prepared according to various techniques, where FIG. 5a is an EFTEM image of a vacuum-dried PBDTTT-CT:[70]PCBM film, FIG. 5b is an EFTEM image of a vacuum-dried PCDTBT:[70]PCBM film, FIG. 5c is an EFTEM image of a solvent-fluxed PBDTTT-CT:[70]PCBM film, and FIG. 5d is an EFTEM image of a solvent-fluxed PCDTBT:[70]PCBM film. The scale bars of FIGS. 5a-5d represent 50 nm. FIGS. 5e and 5f are Gray values of the BHJ films, where FIG. 5e is a Gray value of the PCDTBT:[70]PCBM film, and where FIG. 5f is a Gray value of the PBDTTT-CT:[70]PCBM film. The PBDTTT-CT content along the vertical direction in the vacuum-dried PBDTTT-CT:[70]PCBM film is almost constant, while there is a spontaneous un-favored composition gradient in the vacuum-dried PCDTBT:[70]PCBM with PCDTBT rich at the top surface (cathode side). A clear graded distribution of the PBDTTT-CT and [70]PCBM is provided in the fluxed film with linearly increasing PBDTTT-CT content toward the PEDOT:PSS (anode side), as shown by the Gray value in FIG. 5f. The composition gradient of the PCDTBT:[70]PCBM film was completely reversed after solvent-fluxing, leaving a PCDTBT-rich region close to the PEDOT:PSS which is favored for higher efficiency in the regular structure device. The distribution of polymers and [70]PCBM in the vacuum-dried PBDTTT-CT:[70]PCBM and PCDTBT:[70]PCBM films is nonuniform in the film plane. There are some randomly distributed, large [70]PCBM-rich regions with size ranging from 50-200 nm. Both fluxed BHJ films have more uniform polymer and [70]PCBM domain distribution in the film plane.

Figure 5H:
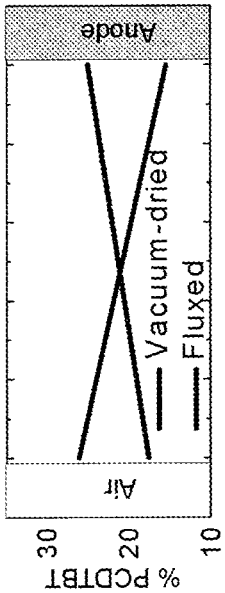
FIG. 5h shows a result of quantitative determination by ellipsometry along the vertical direction of the composition of vacuum-dried and solvent-fluxed PCDTBT:[70]PCBM films.
Figure 5J:
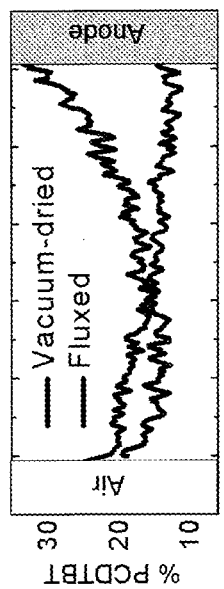
FIG. 5j shows a compositional depth profile of a PCDTBT:[70]PCBM film measured by SIMS.

Spectroscopic ellipsometry measurements were performed to quantitatively verify the vertical composition profile. The PBDTTT-CT:[70]PCBM and PCDTBT:[70]PCBM blends were spun on silicon wafers coated with PEDOT:PSS to maintain the same surface condition as the working device while reducing the complexity of the model required to analyze the ellipsometric data. The optical properties of PEDOT:PSS, PBDTTT-CT, PCDTBT, and [70]PCBM were determined individually and were held fixed when calculating the vertical phase separation. The blended films were discretized into eleven equal segments in the vertical direction, and the percentage of PBDTTT-CT in each segment was allowed to vary in accordance with the Bruggeman effective medium approximation. A linear variation in the PBDTTT-CT and PCDTBT percentage provided the best fit to the experimental data while maintaining a unique solution for the vertical compositional profile. The ellipsometric measurement utilized a 300 μm diameter beam so the measurement reflects the average condition of the sample and does not resolve the fine spatial variations in the compositional profile. FIGS. 5g through 5j provide charts showing compositional percentages of the BHJ films, where FIG. 5g is a result of quantitative determination by ellipsometry along the vertical direction of the composition of vacuum-dried and solvent-fluxed PBDTTT-CT:[70]PCBM films, FIG. 5h is a result of quantitative determination by ellipsometry along the vertical direction of the composition of vacuum-dried and solvent-fluxed PCDTBT:[70]PCBM films, FIG. 5i is a compositional depth profile of PBDTTT-CT:[70]PCBM films measured by secondary ion mass spectrometry (SIMS), and FIG. 5j is a compositional depth profile of PCDTBT:[70]PCBM films measured by SIMS. As shown in FIGS. 5g and 5h, the vacuum-dried PBDTTT-CT:[70]PCBM film has nearly uniform composition distribution in the vertical direction, whereas, the fluxed PBDTTT-CT:[70]PCBM film has a clear composition gradient with more PBDTTT-CT on the bottom surface. The vacuum-dried film of PCDTBT:[70]PCBM blended film has a spontaneous graded composition with PCDTBT rich at the top surface. After methanol-fluxing, the [70]PCBM was extracted toward the top surface which is favored for the regular BHJ device. Both results agree well with the EFTEM result. The blended film structure was modeled using a graded effective median approximation where the weight percentage of PBDTTT-CT in PBDTTT-CT: [70]PCBM blended films at the bottom (anode) and top (cathode) interfaces was determined to be 60% and 27%, respectively. The weight percentage of PCDTBT in PCDTBT:[70]PCBM blended films at the bottom and top interfaces was determined to be 25% and 17% respectively, which is in good accordance with the weight ratio of polymer in the blended film (40% for PBDTTT-CT:[70]PCBM and 20% for PCDTBT:[70]PCBM system).

Figure 6B:
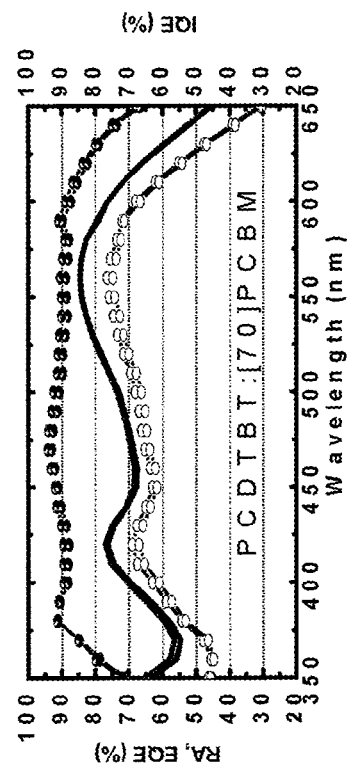
FIG. 6b shows photocurrent data of vacuum dried and solvent-fluxed PCDTBT:[70]PCBM devices under simulated A.M 1.5 illumination.
Figure 6D:
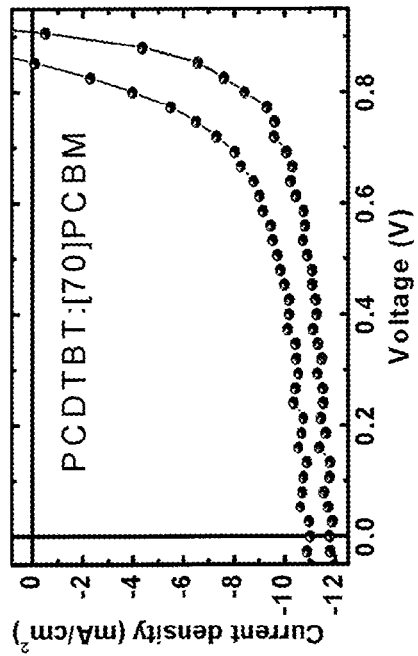
FIG. 6d shows EQE, RA, and IQE for PCDTBT:[70]PCBM devices according to certain embodiments.
Figure 6A:
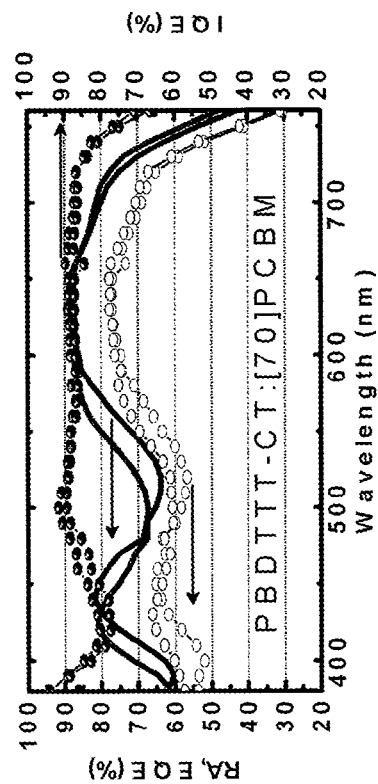
FIG. 6a shows photocurrent data of vacuum dried and solvent-fluxed PBDTTT-CT:[70]PCBM devices under simulated A.M 1.5 illumination.
Figure 6C:
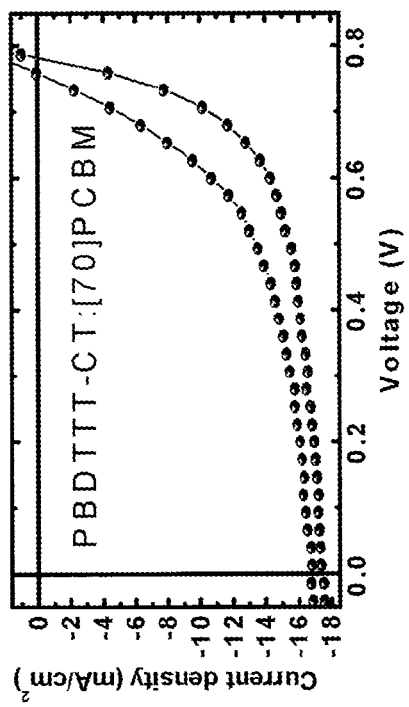
FIG. 6c provides external quantum efficiency (EQE), reflective absorption (RA), and internal quantum efficiency (IQE) for PBDTTT-CT:[70]PCBM devices according to certain embodiments.

Secondary ion mass spectrometry (SIMS) was conducted to directly measure the composition profile of the BHJ films. The content of the polymer was derived from the sulfur atom ratio in the BHJ films, and the results are provided in FIGS. 5i and 5j. The weight percentage of PBDTTT-CT of the vacuum-dried film is relatively uniform across the whole film, while it increases linearly with depth in the fluxed film. After methanol-fluxing, the PBDTTT-CT content on the top of the film reduced to 30 wt %, while that at the bottom of the film increased to 51 wt %. The same variation trend of composition profile was observed for vacuum-dried and methanol-fluxed PCDTBT:[70]PCBM films. The composition profile of PCDTBT of the vacuum-dried PCDTBT:[70] PCBM showed a negative slope, while the slope was changed to positive in methanol-fluxed PCDTBT:[70] PCBM film. These results are in excellent agreement with the EFTEM and ellipsometric results and the weight ratio of polymers in the BHJ films, which further confirms the formation of gradient BHJ films by the solvent-fluxing method. FIGS. 6a-6d illustrate the photocurrent density-voltage ($J_{ph}$-V) characteristics of vacuum-dried and solvent-fluxed devices as well as the reflective absorption (RA), external quantum efficiency (EQE) and internal quantum efficiency (IQE) of PBDTTT-CT:[70]PCBM and PCDTBT: [70]PCBM. FIG. 6a provides photocurrent data of vacuum dried (black) and solvent-fluxed (red) devices of PBDTTT-CT:[70]PCBM under simulated A.M 1.5 illumination. FIG. 6b provides photocurrent data of vacuum dried (black) and solvent-fluxed (red) devices of PCDTBT:[70]PCBM under simulated A.M 1.5 illumination. FIG. 6c provides EQE (open circle lines), RA (solid lines), and IQE (solid circle lines) for devices of PBDTTT-CT:[70]PCBM, with vacuum-dried devices illustrated with black and solvent-fluxed devices illustrated with red. FIG. 6d provides EQE (open circle lines), RA (solid lines), and IQE (solid circle lines) for devices of PCDTBT:[70]PCBM, with vacuum-dried devices illustrated with black and solvent-fluxed devices illustrated with red. The device's performance of PBDTTT-CT:[70] PCBM, PCDTBT:[70]PCBM, P3HT:[60]ICBA, FTQ:[70] PCBM is summarized in Table 1 shown in FIG. 7 with statistics based on more than 20 devices for each category. The PCEs of PBDTTT-CT:[70]PCBM, PCDTBT:[70] PCBM, P3HT:[60]ICBA, FTQ:[70]PCBM after solvent-fluxing were increased from 6.9% to 8.6%, 5.4% to 7.2%, 4.9% to 6.0%, and 4.4% to 6.0%, respectively. The fill factor (FF) of 62.5%, IQE of 90% and efficiency of 8.6% for PBDTTT-CT:[70]PCBM based devices, and FF of 67.3%, IQE of >90% and efficiency of 7.2% for PCDTBT:[70] PCBM based devices are the highest reported values for these material systems. The slight $V_{OC}$ variation might be caused by the interplay of various effects of solvent fluxing: passivation effect increases $V_{OC}$ while increased crystallinity reduces $V_{OC}$.

In various embodiments, the solvent-fluxing method produces graded BHJ structures according to some or all of the following: 1) The boiling point of the solution additive is higher than the working solvent so that only the additive remains in the blended films before the fluxing process; 2) The additive should selectively dissolve fullerene-derivatives so that it brings fullerene-derivatives to the surface during the solvent-fluxing process; 3) The fluxing solvent should mix well with additive but not dissolve polymers or fullerene-derivatives, so that it can pull the additive as well as fullerene-derivatives to the surface and only wash off the additive; and 4) Consideration of a time interval between the deposition of the active layer and the solvent-fluxing so that the fullerene-derivative extraction process does not interrupt or damage the polymer crystallization. For instance, the working solvent drying process can play a role in determining the morphology of BHJs because the self-organization of polymer predominately occurs in wet films. It is expected that performing the solvent-fluxing process too early interrupts the polymer crystallization, while performing the solvent-fluxing process too late is not effective in extracting fullerene-derivatives because the framework of the polymer will be too rigid. It was found that a time interval of 10 minutes was optimal for the PBDTTTCT:[70]PCBM, PCDTBT:[70]PCBM, and FTQ:[70]PCBM-based devices, and 30 min for a P3HT:[60]ICBA-based device, although other ranges are possible. Further, the thickness of the active layer should match the penetration depth of the flux solvent (e.g., methanol) so that the additive (e.g., DIO) near the PEDOT:PSS side of the substrate can also be extracted out. From the various characterizations on the PBDTTT-CT:[70] PCBM (100 nm) and PCDTBT:[70]PCBM (80 nm) films shown in FIG. 4, the depth composition profile of the films can be modified at the PEDOT:PSS side, which indicates the penetration depth of the methanol is larger than 100 nm.

Figure 8A:
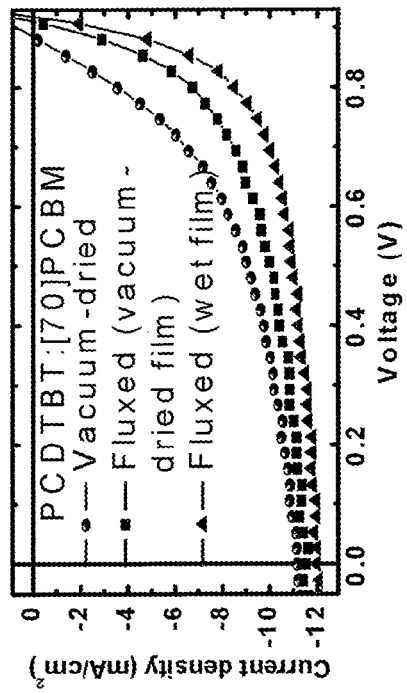
FIG. 8a shows photocurrent curves of vacuum-dried, fluxed wet, and fluxed pre-vacuum-dried PBDTTT-CT:[70]PCBM films.
Figure 8B:
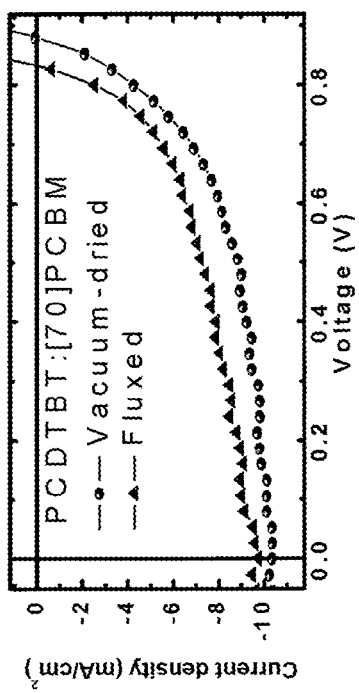
FIG. 8b shows photocurrent curves of vacuum-dried, fluxed wet, and fluxed pre-vacuum-dried PCDTBT:[70]PCBM films.
Figure 8C:
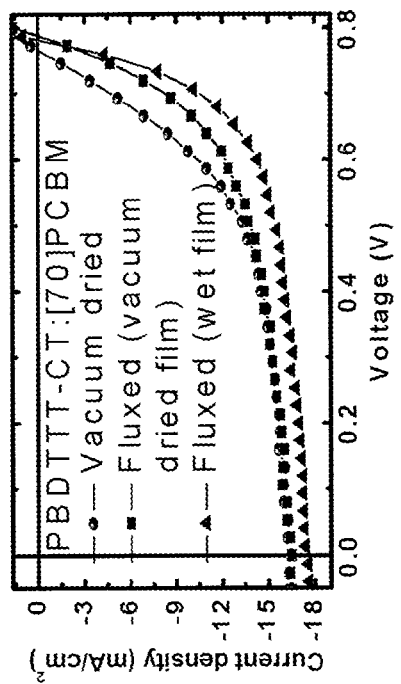
FIG. 8c shows photocurrent curves of the vacuum-dried and solvent-fluxed PBDTTT-CT:[70]PCBM inverted structure devices.
Figure 8D:
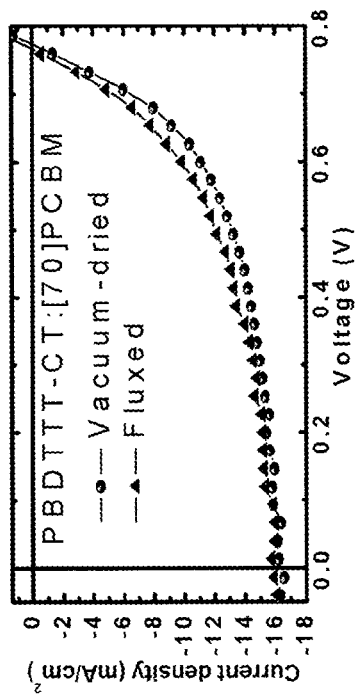
FIG. 8d shows photocurrent curves of the vacuum-dried and solvent-fluxed PCDTBT:[70]PCBM inverted structure devices.

Several other low boiling point solvents, including methanol, ethanol, and isopropanol, were tested for the fluxing process. All of these low boiling point solvents mix well with DIO and do not dissolve fullerene-derivatives or the donor polymers. All of them resulted in almost the same device performance enhancement compared to the vacuum-dried devices. The performances of the PBDTTT-CT:[70] PCBM and PCDTBT:[70]PCBM devices were also compared using two different solvent treatments, namely vacuum-drying the films to remove DIO prior to methanol-fluxing and utilizing the wet-flux process described herein. FIGS. 8a through 8d provides the photocurrents results, where FIG. 8a shows photocurrent curves of the vacuum-dried film (black), fluxed wet film (red), and fluxed pre-vacuum-dried film (blue) of PBDTTT-CT:[70]PCBM, FIG. 8b shows photocurrent curves of the vacuum-dried film (black), fluxed wet film (red), and fluxed pre-vacuum-dried film (blue) of PCDTBT:[70]PCBM, FIG. 8c shows photocurrent curves of the vacuum-dried and solvent-fluxed inverted structure devices of PBDTTT-CT:[70]PCBM, and FIG. 8d shows photocurrent curves of the vacuum-dried and solvent-fluxed inverted structure devices of PCDTBT:[70] PCBM. Efficiency enhancements were observed rising from 6.9% to 7.4% for PBDTTT-CT:[70]PCBM devices and from 5.0% to 6.0% for PCDTBT:[70]PCBM devices after methanol-fluxing of the vacuum-dried films, which can be ascribed to the reported surface passivation effect. In contrast, methanol-fluxing of the wet films gave much higher efficiencies of 8.6% for PBDTTTCT:[70]PCBM and 7.2% for PCDTBT:[70]PCBM devices, demonstrating the importance of the graded BHJs in efficiency enhancement.

The graded structure of the solvent-fluxed BHJ devices was further investigated regarding performance enhancements over non-fluxed devices by fabricating inverted structure devices with a device structure of: ITO/Cesium carbonate ($Cs_2CO_3$) (0.3 nm)/PBDTTT-CT (or PCDTBT):[70]PCBM (80-100 nm)/Molybdenum trioxide ($MoO_3$) (8 nm)/Ag. Such inverted structure devices give comparable device performances with regular structure BHJ devices if the BHJ films were vacuum-dried as shown in FIGS. 8c and 8d. After a methanol-fluxing process which brings [70]PCBM to the top surface, both $J_{SC}$ and FF reduced in the inverted graded BHJ devices, and the PCE of the devices decreased from 6.8% to 6.2% for PBDTTT-CT:[70]PCBM devices, and from 5.0% to 4.1% for PCDTBT:[70]PCBM devices, respectively. This result excludes the other factors, including enhanced carrier mobility, molecular crystallinity and/or orientation variation (if there is) by the solvent-fluxing process, and confirmed graded BHJ junctions as dominating mechanism for the observed efficiency enhancement.

Useful guidelines for the formation of graded BHJ by the solvent-fluxing methods herein may include some or all of the following according to certain aspects: 1) the boiling point of the solution additive should be higher than the working solvent so that only the additive remains in the blended films before the fluxing process; 2) the additive should selectively dissolve fullerene-derivatives so that it brings fullerene-derivatives to the surface during the solvent-fluxing process; 3) the fluxing solvent should mix well with additive but not dissolve polymers or fullerene-derivatives, so that it can pull the additive as well as fullerene-derivatives to the surface and only wash off the additive; and 4) there is an optimal time interval between the deposition of the active layer and the solvent-fluxing so that the fullerene-derivative extraction process does not interrupt or damage the polymer crystallization. Previous studies show that the working solvent drying process plays an important role in determining the morphology of BHJs because the self-organization of polymer predominately occurs in wet films. It is expected that performing the solvent-fluxing process too early interrupts the polymer crystallization, while performing the solvent-fluxing process too late is not effective in extracting fullerene-derivatives because the framework of the polymer will be too rigid. The photocurrent curves of the devices with different time intervals are shown in FIG. 9. It was found that a time interval of 10 minutes was optimal for the PBDTTT-CT:[70]PCBM, PCDTBT:[70]PCBM, and FTQ:[70]PCBM-based devices, and 30 min for a P3HT:[60]ICBA-based device. In certain aspects, the thickness of the active layer should match the penetration depth of the solvent, e.g., the thickness of the active layer should match the penetration depth of the methanol solvent so that DIO near the PEDOT:PSS side can also be extracted out. From the various characterizations on the PBDTTT-CT:[70]PCBM (100 nm) and PCDTBT:[70]PCBM (80 nm) films shown in FIG. 4, the depth composition profile of the films can be modified at the PEDOT:PSS side, which indicates the penetration depth of the methanol is larger than 100 nm.

Example 1

Device Fabrication:

PEDOT:PSS (Baytron-P 4083) was spin coated on clean ITO substrate at a speed of 3000 rpm. The film was then annealed at 130° C. for 30 min. Different polymer:fullerene-derivative solutions were then spin coated on top of dry PEDOT:PSS film in the $N_2$ filled glove box. The polymers and fullerene-derivatives concentration and their spin coating parameters are shown in Table 2).

TABLE 2

| Materials | Polymer and fullerene-derivative ratio (polymer concentration) | Working solvent | DIO volume ratio | Spin coating parameter |
|---|---|---|---|---|
| PBDTTT-CT:$PC_{71}BM$ | 1:1.5 (10 mg/ml) | DCB | 3% | 900 rpm for 60 sec. |
| PCDTBT:$PC_{71}BM$ | 1:4 (4 mg/ml) | DCB:CB (3:1 V/V) | 3% | 2400 rpm for 14 sec. |
| P3HT:$IC_{60}BA$ | 1:1 (17.5 mg/ml) | DCB | 3% | 800 rpm for 20 sec. |
| FTQ:$PC_{71}BM$ | 1:1 (15 mg/ml) | DCB | 3% | 1000 rpm for 50 sec. |

The blended films were fluxed by methanol or other low boiling point solvent at a spin coating speed of 2500 rpm for 20 sec. The device was finished by thermal evaporating calcium (20 nm) and aluminum (100 nm).

Blend Film Characterization:

Cross-sectional TEM samples with thickness less than 100 nm were prepared with a focused ion beam at 30 kV. A current as small as 10 pA was used for final polishing in order to effectively minimize ion-beam-induced sample damage. TEM samples were examined with a Zeiss Libra 120 equipped with an in-column (Omega) energy filter. TEM experiments were performed at 120 kV, and emission current as low as 5 μA was used to minimize electron-beam-induced sample damage. Selected area electron diffraction aperture was about 1 μm in diameter, with calibration conducted using Al (111) (0.234 nm); The vertical composition profile of the blended film was quantitatively measured using a J.A Woollam Co, M-2000 variable angle spectroscopic ellipsometer. Measurements were performed between 192-1698 nm using a 300 μm diameter focused beam at angles of incidence of 55°, 65° and 75°. The optical properties of each component of the polymer blend (PBDTTT, PCDTBT, [70]PCBM) were characterized independently. The vertical composition profiles of the blended layers were then modeled using a linearly graded effective medium approximation where the optical properties were fixed with the previously determined values. XRD measurements were performed with a Rigaku D/Max-B X-ray diffractometer with Bragg-Brentano parafocusing geometry, a diffracted beam monochromator, and a conventional copper target x-ray tube set to 40 KV and 30 mA. The single path absorption was measured using an Evolution 201 UV-Visible spectrometer (thermo Scientific).

SIMS Characterization:

The BHJs were prepared on conductive ITO substrates or highly doped silicon substrates which were covered by PEDOT:PSS layers to avoid/reduce the charging effect. Data were calibrated in the polymer layers only. Repeat analysis on each sample was done to verify the repeat precision of the technique. The composition depth profile was extracted from the element signal when the matrix current reached a steady state, which is generally a few nms after the sputtering starts, to avoid the influence of the surface contamination or preequilibrium sputtering before the SIMS measurement.

Device Characterization:

The photocurrent characteristic was measured using a calibrated Xenon-lamp-based solar simulator (Oriel 67005). EQE was measured with a Newport QE measurement kit by focusing a monochromatic beam of light onto the devices.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of forming a graded bulk heterojunction (BHJ) structure, the method comprising:
    providing a solution including a polymer donor material, an acceptor material, and an additive;
    introducing a fluxing solvent to the solution; and
    removing the fluxing solvent and the additive to form a graded BHJ structure, wherein the graded BHJ structure includes a graded composition of donor and acceptor materials with an increasing acceptor material percentage along a first direction.

2. The method of claim 1, wherein the acceptor material comprises a fullerene-derivative.

3. The method of claim 2, wherein the fullerene derivative is selected from the group consisting of [6,6]-phenyl-C61-butyric acid ($PC_{60}BM$), [6,6]-(4-fluoro-phenyl)-C61-butyric acid methyl ester (FPCBM), [6,6]-phenyl-C71 butyric acid methyl ester ($PC_{70}BM$), indene-C60 bisadduct ($IC_{60}BA$), indene-C70 bisadduct ($IC_{70}BA$), fullerene-C60, fullerene-C70, carbon nanotubes (CNT), a carbon onion, and combinations thereof.

4. The method of claim 1, wherein the donor material includes a polymer donor selected from the group consisting of poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl] (PBDTTT-CT), poly[N-9'-hepta-decanyl-2,7-carbazole-alt-5,5-(4',7'-di-2-thienyl-2',1',3'-enzothiadiazole)] (PCDTBT), Poly[6-fluoro-2,3-bis-(3-octyloxyphenyl) quinoxaline-5,8-diyl-alt-thiophene-2,5-diyl] (FTQ), subphthalocyanine (SubPC), copper phthalocyanine (CuPc), Zinc phthalocyanine (ZnPc), poly (3-hexylthiophene) (P3HT), poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), poly-(2,5-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9''-hepta-decanyl-2,7-carbazole-alt-5,5-(4',7'-di-2-thienyl-2',1',3'-benzothiadiazole)] (PCDTBT), poly[4,8-bis-substituted-benzo[1,2-b:4,5-b']dithiophene-2,6-diyl-alt-4-substituted-thieno[3,4-b]thio-phene-2,6-diyl] (PBDTTT-C-T), Poly (benzo[1,2-b:4,5-b']dithiophene-alt-thieno[3,4-c]pyrrole-4,6-dione (PBDTTPD), poly((4,4-dioctyldithieno(3,2-b:2',3'-d)silole)-2,6-diyl-alt-(2,1,3-benzothiadiazole)-4,7-diyl) (PSBTBT), and combinations thereof.

5. The method of claim 1, wherein the acceptor material comprises a fullerene, fullerene derivative, a perylene, a perylene derivative, a 2,7-dicyclohexyl benzo[lmn][3,8] phenanthroline derivative, a 1,4-diketo-3,6-dithienylpyrrolo [3,4-c:]pyrrole (DPP) derivative, a tetracyanoquinodimethane (TCNQ) derivative, a poly(p-pyridyl vinylene) (PPyV) derivative, a 9,9'-bifluorenylidene (99BF) derivative, a benzothiadiazole (BT) derivative, and combinations thereof.

6. The method of claim 1, wherein the acceptor material comprises [70]PCBM and the donor comprises one of poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno [3,4-b]thiophen-4,6-diyl] (PBDTTT-CT) or poly[N-9'-hepta-decanyl-2,7-carbazole-alt-5,5-(4',7'-di-2-thienyl-2',1',3'-enzothiadiazole)] (PCDTBT) or Poly[6-fluoro-2,3-bis-(3-octyloxyphenyl) quinoxaline-5,8-diyl-alt-thiophene-2,5-diyl] (FTQ).

7. The method of claim 1, wherein removing the fluxing solvent and the additive comprises:
    spinning off the fluxing solvent, wherein during the spinning the additive fluxes away in a fluxing direction along with the fluxing solvent.

8. The method of claim 1, wherein the additive comprises a material having a boiling point that is greater than a boiling point of a working solvent used to dissolve the polymer donor material and the acceptor material.

9. The method of claim 1, wherein the additive comprises 1,8-diiodooctane (DIO) and wherein the working solvent comprises 1,2-Dichlorobenzene (DCB).

10. The method of claim 1, wherein the additive is selected from the group consisting of 1,8-diiodooctane (DIO) chlorobenzene, 4-butanedithiol, 1,6-hexanedithiol, 1,8-octanedithiol, 1,9-nonanedithiol, class of 1,8-di(R)octanes with various functional groups, di(ethylene glycol)-diethyl ether, and n-methyl-2-pyrrolidinone, 1,6-diiodohexane, 1,4-diiodobutane.

11. The method of claim 1, wherein providing a solution includes applying a layer of the solution on a substrate to form a solution layer on the substrate, and wherein introducing a fluxing solvent to the solution includes introducing the fluxing solvent to the solution layer.

12. The method of claim 11, wherein applying a layer includes spin coating the solution onto the substrate.

13. The method of claim 11, wherein the substrate includes indium tin oxide (ITO).

14. The method of claim 11, further including forming an electrode layer on a first side of the graded BHJ structure opposite the substrate, wherein the acceptor material percentage is higher on the first side.

15. The method of claim 1, wherein the fluxing solvent comprises an alcohol.

16. The method of claim 1, wherein the fluxing solvent comprises one of methanol, ethanol or isopropanol.

17. A photoactive device, comprising:
a first electrode;
a second electrode; and
a graded bulk heterojunction (BHJ) structure between the first and second electrodes, wherein the graded BHJ structure is formed according to the method of claim 1, and wherein the first direction is a direction from the first electrode to the second electrode.

* * * * *